United States Patent Office 3,507,759

Patented Apr. 21, 1970

3,507,759

REMOVAL OF CONDUCTIVE METAL OXIDE FROM A METAL OXIDE COATED INSULATING SUBSTRATE

Robert Frank Shaw, Stamford, Conn., assignor to American Cyanamid Company, Stamford, Conn., a corporation of Maine No Drawing. Filed Sept. 15, 1966, Ser. No. 579,503
Int. Cl. C23b 3/04
U.S. Cl. 204—143 4 Claims

ABSTRACT OF THE DISCLOSURE

Oxides of titanium, tin and the like are coated on siliceous surfaces, e.g. glass, then etched by cathodic reduction and dissolution in strong acid electrolyte, e.g. sulfuric acid. Conductive metal oxide patterns are formed on glass surfaces by such coating and etching technique. Wettability of the metal oxide by the electrolyte is improved by including chromic acid in the strong acid electrolyte solution.

This invention relates to the electrochemical stripping of electrically conductive films from electrically insulating substrates. More particularly, this invention relates to a method of establishing an electrically non-conducting area of any desired pattern on the surface of a material comprising an electrically conductive surface layer and an electrically insulating substrate material.

Electrically insulating substrate materials coated wholly or in part with electrically conducting metal oxide films are employed for a wide variety of purposes. For example, electrical circuits necessarily require the ability of providing electrically conducting and electrically insulating adjacent areas on an electrically insulating substrate. Other applications require optical quality in the structure. Thus, in very sensitive electrical instruments utilizing glass windows protecting a measuring stylus or pointer, the windows are required to be static-free. Hence, while it is desirable to have an electrically conducting window, the edges of the insulating glass substrate must be electrically non-conducting to provide points or areas for mounting in a metallic enclosure. Still another application is area heating equipment which requires the use of electrically conducting metal oxide coated electrically insulating substrate materials wherein strips of the conducting metal oxide film surface have been removed from the edges to facilitate mounting.

Several techniques are known for achieving electrically non-conducting areas on the surface of an insulator coated on the surface with an electrically conductive metal oxide. Simple chemical reaction, for example, is often employed to etch an electrically non-conductive pattern in the surface of the material. The effect is sometimes achieved also by placing a mask or cutout, providing a negative of the pattern to be imposed, in register with the electrically insulating substrate and then spraying, vacuum depositing or sputtering the conductive metal oxide through the mask to establish the desired pattern of conductive and non-conductive areas on the surface of the substrate.

Numerous difficulties beset the foregoing techniques. Simple chemical reaction, for example, tends to etch the insulating substrate thereby reducing the optical quality of the substrate. Damage of the substrate also often occurs when it is attempted by means of a mask to establish a pattern of conductivity and non-conductivity due to the difficulty of perfect registration of the mask with the substrate. Moreover, when the masking technique is employed, adhesion of the conducting metal oxide to the substrate is extremely difficult to achieve satisfactorily.

An object of the present invention is to establish by convenient means an electrically non-conducting area of any desired size, shape, or pattern on the electrically conducting metal oxide film surface of a conducting metal oxide coated insulating substrate without damaging the insulating substrate and without the attendant problems of masking techniques.

Briefly, these advantages are achieved by contacting the electrically conducting metal oxide surface layer in the desired pattern with an electrolyte solution, electrolyzing said solution while in contact with the metal oxide layer, and thereafter removing the product which forms by reaction of the material released by the electrolysis and the metal oxide layer in contact with said material.

The electrically conducting metal oxide coated electrically insulating substrate includes a wide variety of known and commercially available materials. Thus the substrate may be any electrically insulating refractory material to which an electrically conducting metal oxide film may be adhered. Such insulating materials include vitreous siliceous substances such as plate glass, quartz, fused silica, and the like, and ceramics, which include mixtures of various finely divided minerals and rocks which form a rock-like mass when heated to high temperatures. A common ceramic is a fused mixture of powdered quartz, powdered feldspar, and kaolinite. The essential characteristics of the substrate material are, of course, that it be electrically insulating, receptive to an electrically conducting metal oxide surface film, and that it be chemically inert to the electrolyte solution placed in contact with the metal oxide coated substrate.

The metal oxide surface layer material is any metal oxide which strongly adheres to the electrically insulating substrate while being electrically conductive. Preferably, the metal oxide will be a film sufficiently thin to provide transparency. Generally, these are metal oxides such as tin dioxide, $SnO_2$, and titanium dioxide, $TiO_2$, which have been rendered conductive by "doping" with a compound such as antimony. Electrical conductivity may be induced in the metal oxide film by other than additive "doping" techniques. For example, titanium halide or tin halide, deposited on the insulating substrate by any convenient technique, may be reduced to the oxide, thereby becoming electrically conductive. Electrical conductivity may also be achieved by vacuum depositing the metal oxide on the substrate. This reduces the oxide thereby providing electrical conductivity by the increased metal content.

Electrolyte solutions suitable for practice of the invention include any such solutions which on electrolysis release or produce a material chemically reactive with the electrically conductive metal oxide layer to form a product which is removable by convenient means such as washing with water or with a suitable solvent or simply by washing with the electrolyte solution itself. While not critical it is preferred that the product of reaction between the material produced by the electrolysis and the metal oxide be a compound which is soluble in the electrolyte solution or a wash solution.

Of course, those electrolyte solutions which tend to damage the electrically insulating substrate should be avoided. For example, while most mineral acids such as hydrochloric, nitric, phosphoric, and sulfuric are useful, hydrofluoric acid should be avoided since it will etch the substrate material particularly when it is siliceous. Besides mineral acids, suitable electrolyte solutions include the common bases such as the alkali and alkaline earth metal hydroxides, e.g., sodium hydroxide, potassium hydroxide, calcium hydroxide, and the like, and aqueous solutions of salts such as the chlorides, bromides, sulfates, and nitrates of alkali and alkaline earth metals, e.g., potassium sulfate, sodium sulfate, and the like. Particularly preferred are aqueous solutions of alkali metal hydroxides and mixtures of the foregoing such as dilute or concentrated aqueous mixtures of sulfuric acid and chromic acid or chromic oxide. Aqueous electrolyte solutions are the most convenient and are preferred although in some instances it may be desirable to employ electrically conducting non-aqueous solutions.

As already indicated, the invention is practiced essentially in three steps: (1) contacting the metal oxide surface layer with the electrolyte solution, (2) electrolyzing said solution while in contact with the metal oxide layer, and (3) removing the product resulting from reaction of the electrolysis product and the metal oxide layer. The contacting step is achieved by any convenient means such as immersing, dipping, or spraying. The area or point of contact of the electrolyte solution with the metal oxide surface layer will define the electrically non-conducting area or pattern resulting from the three step operation. It will be apparent that a plurality of means will be effective for imposing any desired pattern of non-conducting area. For example, an electrolyte solution impermeable adhesive backed temporary mask may initially be imposed on the metal oxide surface layer. The mask thus defines the intended non-conducting pattern and the method of the invention is then practiced.

Conventional modes of electrolysis are practiced in the electrolysis step. For example, an electrical lead may connect the metal oxide layer with one terminal of an AC or DC source and a second lead may be connected with the other terminal of the source and an electrode immersed in the electrolyte solution. It is important in this step that the electrode not touch the metal oxide surface layer since, in so doing, the system would be short circuited by direct conduction through the metal oxide surface layer. The effect of electrolysis is production of an active material, such as sodium metal when the electrolyte is an aqueous solution of sodium hydroxide, which reacts with the metal oxide surface layer to produce a compound which, preferably, is soluble in the electrolyte solution.

In the third step of the invention, the product resulting from reaction of the electrolysis product and the metal oxide surface layer is removed by any convenient means such as by dissolution in the electrolyte or by washing with water or with the electrolyte solution, or by scraping, and the like.

Concentration of electrolyte in the electrolyte solution is not critical nor is the design and arrangement of the electrolysis apparatus. Moreover, it is necessary only that sufficient current be passed through the electrolyte solution to form the electrolysis product which then reacts with the metal oxide surface layer.

The following examples are presented to further illustrate but not to limit the invention. All parts and percentages are by weight unless otherwise specified.

EXAMPLE 1

Except for a quarter inch strip along one conductive surface edge, the entire conductive surface of a four square inch sample of "Nesa" glass (transparent conductive tin dioxide coated glass) is covered with masking tape. Electrical contact is made between the exposed conductive tin dioxide surface film and the negative terminal of a 20 volt power supply and the conductive glass plate is slowly immersed in an aqueous electrolyte solution of concentrated sulfuric acid saturated with chromic acid. An electrode, connected to the positive terminal of the power supply, is then immersed in the solution with care being taken to avoid contact with the conductive glass plate. Substantially immediately on immersion, the conductive tin dioxide is removed cleanly from the exposed (unmasked) portion of the sample and without damage to the glass substrate. Slow immersion is preferred to achieve uniform removal of the tin dioxide. The sample is then removed from the solution and remaining traces of electrolysis product, most of which remains as soluble reaction product in the electrolyte solution, and electrolyte are rinsed off with water.

EXAMPLE 2

Essentially as described in Example 1, a transparent, conductive titanium dioxide coated glass plate is masked to provide a desired pattern of exposed conductive titanium dioxide surface, electrical connection is made, and the sample is immersed in the electrolyte solution and electrolyzed. The titanium dioxide is removed cleanly from the exposed areas and no damage is done to the glass substrate. The electrolyte solution containing concentrated sulfuric acid saturated with chromic acid is preferred since it provides excellent surface wetting.

I claim:

1. In a method of removing coated electrically conductive oxide of tin or titanium from selected areas of a vitreous siliceous surface which method comprises contacting the coated oxide on said selected areas with an electrolyte solution and passing direct current through said electrolyte solution between an anode and said selected areas as a cathode, the improvement wherein the electrolyte of said electrolyte solution consisting essentially of a mineral acid selected from sulfuric, hydrochloric, nitric and phosphoric acids in mixture with chromic acid, the latter in quantity sufficient to improve wettability of said selected areas by said electrolyte solution.

2. The improvement defined by claim 1 wherein said chromic acid is present in concentration sufficient to saturate the mineral acid solution with chromic acid.

3. The improvement defined by claim 1 wherein said mineral acid is sulfuric acid.

4. The improvement defined by claim 2 wherein said mineral acid is sulfuric acid.

References Cited

UNITED STATES PATENTS

| | | | |
|---|---|---|---|
| 2,695,380 | 11/1954 | Mayer et al. | 204—56 |
| 2,504,178 | 4/1950 | Burnham et al. | 204—32 |
| 2,944,926 | 7/1960 | Gaiser | 204—143 |

ROBERT K. MIHALEK, Primary Examiner

U.S. Cl. X.R.

204—141